United States Patent
Endo (10) Patent No.: US 8,030,609 B2
(45) Date of Patent: Oct. 4, 2011

(54) READ CIRCUIT, VARIABLE RESISTIVE ELEMENT DEVICE, AND IMAGING DEVICE

(75) Inventor: Tsutomu Endo, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 470 days.

(21) Appl. No.: 12/314,487

(22) Filed: Dec. 11, 2008

(65) Prior Publication Data

US 2009/0167912 A1    Jul. 2, 2009

(30) Foreign Application Priority Data

Dec. 28, 2007  (JP) .................................. 2007-339617

(51) Int. Cl.
*H03F 3/08* (2006.01)
(52) U.S. Cl. ............... 250/214 A; 250/370.14; 250/393; 327/336
(58) Field of Classification Search .................. 348/294, 348/308; 250/214 A, 336.1, 370.14, 370.15, 250/393; 327/341, 362
See application file for complete search history.

(56) References Cited

U.S. PATENT DOCUMENTS

| | | | | |
|---|---|---|---|---|
| 5,646,573 A | * | 7/1997 | Bayruns et al. | 330/59 |
| 5,965,892 A | * | 10/1999 | Tanaka | 250/370.08 |
| 7,183,531 B2 | * | 2/2007 | Olsen et al. | 250/208.1 |
| 2009/0167406 A1 | * | 7/2009 | Endo | 327/336 |

FOREIGN PATENT DOCUMENTS

| | | |
|---|---|---|
| JP | 3821040 | 6/2006 |
| JP | 2007-33177 | 2/2007 |

* cited by examiner

*Primary Examiner* — Huy K Mai (74) *Attorney, Agent, or Firm* — McGinn IP Law Group, PLLC (57) ABSTRACT

A read circuit includes: an integration circuit section configured to perform an integral operation and whose input is connected to an integration node; and a bias circuit connected between a connection node to which a variable resistive element is connected and the integration node. The bias circuit includes: an integration transistor whose source and drain are respectively connected to the connection node and the integration node; an operational amplifier whose output is connected to a gate of the integration transistor, to whose first input a bias voltage is supplied, and whose second input is connected to the source of the integration transistor; and at least one diode element that is connected between the gate and source of the integration transistor and clips a gate-source voltage of the integration transistor.

13 Claims, 7 Drawing Sheets

READ CIRCUIT, VARIABLE RESISTIVE ELEMENT DEVICE, AND IMAGING DEVICE

INCORPORATION BY REFERENCE

This application is based upon and claims the benefit of priority from Japanese patent application No. 2007-339617, filed on Dec. 28, 2007, the disclosure of which is incorporated herein in its entirely by reference.

BACKGROUND OF THE INVENTION

1. Field of the Invention

The present invention relates to a read circuit, a variable resistive element device, and an imaging device. In particular, the present invention relates to a reset operation of an integration circuit in a read circuit that uses the integration circuit for sensing a current flowing through a variable resistive element.

2. Description of Related Art

A technique for sensing a current flowing through a variable resistive element whose resistance is variable is one of techniques applied to various technical fields. One of applications of this technique is an imaging device using a thermoelectric conversion element such as a bolometer. The thermoelectric conversion element is an element in which a temperature variation associated with an incidence of infrared light appears as a variation in its resistance, and is sensitive to the incident infrared light. The imaging device is provided with the thermoelectric conversion elements that are one-dimensionally or two-dimensionally arranged. An infrared image can be obtained by applying a predetermined bias voltage to each thermoelectric conversion element of the imaging device and thereby sensing a current flowing through the each thermoelectric conversion element.

One of methods for sensing a current flowing through a variable resistive element is to integrate the current flowing through the variable resistive element with the use of an integration circuit to extract it as a voltage signal. Japanese patent No. 3821040 discloses an imaging device provided with a read circuit that senses a current flowing through a thermoelectric conversion element based on such a method.

Figure 1:
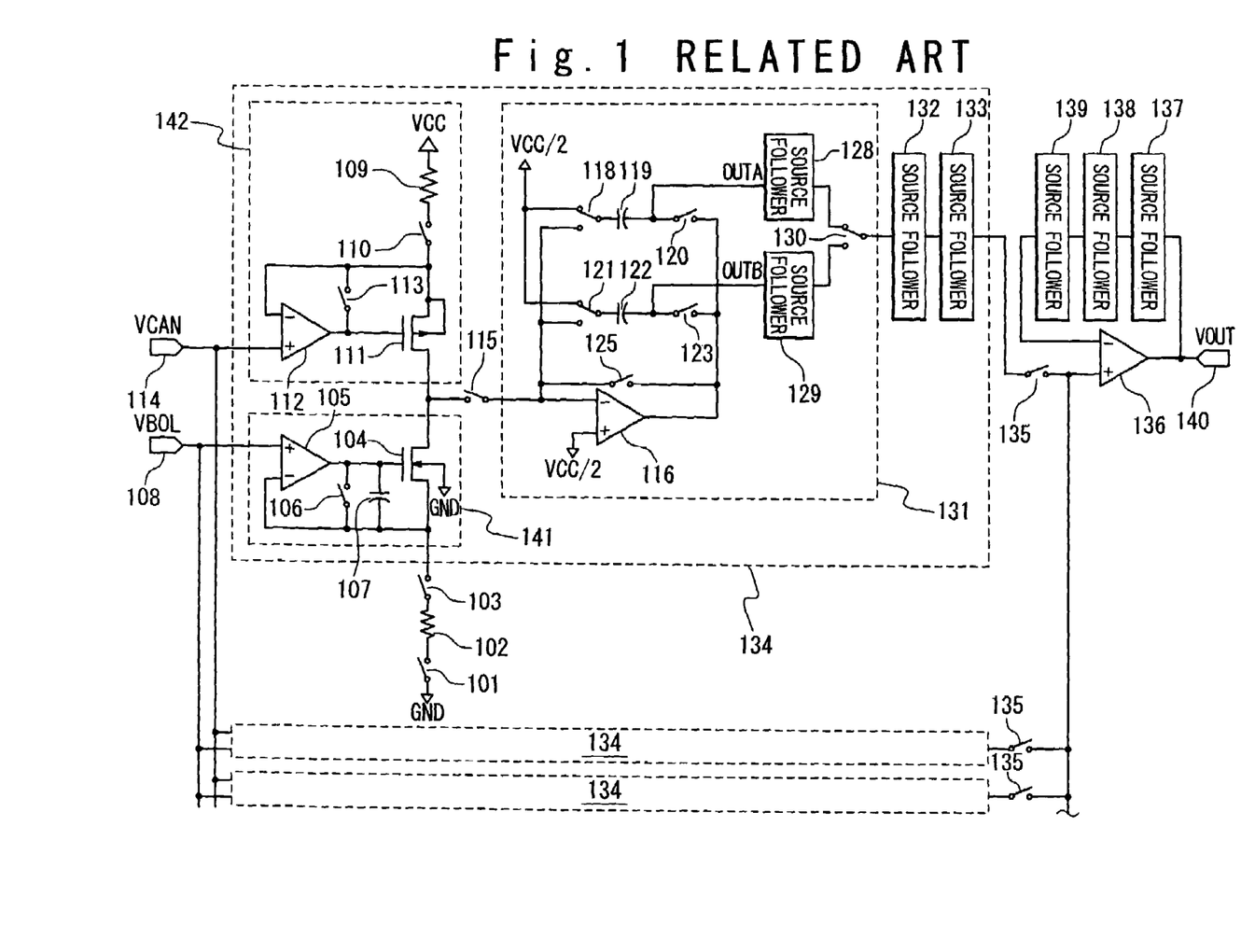
FIG. 1 is a circuit diagram illustrating a configuration of a read circuit according to a related art.

FIG. 1 is a conceptual diagram illustrating a configuration of the imaging device, particularly a configuration of a read-out circuit 134, disclosed in Japanese patent No. 3821040. The imaging device has: a plurality of read circuits 134; switches 135; an output buffer 136; and three source followers 137 to 139 provided in series along a feedback loop of the output buffer 136. The switches 135 are used for selecting any of the plurality of read circuits 134. The output buffer 136 performs a voltage follower operation and outputs an output signal VOUT whose voltage level is the same as that of a voltage signal received from the selected read circuit 134.

The read circuit 134 performs an operation for sensing a current flowing through a thermoelectric conversion element 102. In FIG. 1, only one thermoelectric conversion element 102 is illustrated; however, it should be appreciated that a number of thermoelectric conversion elements 102 are actually arranged on a substrate, and the read circuit 134 senses a current flowing through the thermoelectric conversion element 102 selected by a pixel switch 101 and a horizontal switch 103.

The read circuit 134 includes a bias circuit 141, a bias cancel circuit 142, and an integration sample hold circuit 131. An output of the integration sample hold circuit 131 is connected to the switch 135 through two source followers 132 and 133.

The bias circuit 141 has a function of applying to the thermoelectric conversion element 102 the same bias voltage as a bias voltage VBOL applied to a bias voltage terminal 108. More specifically, the bias circuit 141 includes an integration transistor 104, an operational amplifier 105, a switch 106, and a bypass capacitor 107. As the integration transistor 104, an N-channel MOSFET is used. A gate of the integration transistor 104 is connected to an output of the operational amplifier 105, and the switch 106 and the bypass capacitor 107 are connected in parallel between the gate and a source of the integration transistor 104. An inverting input of the operational amplifier 105 is connected to the source of the integration transistor 104, and a non-inverting input terminal of the operational amplifier 105 is connected to the bias voltage terminal 108.

The operational amplifier 105 plays a role of compensating a gate-source voltage drop in the integration transistor 104. As is widely known, when an N-channel MOSFET is in the ON state, a voltage drop comparable to its threshold voltage appears between the gate and the source. The operational amplifier 105 compensates the voltage drop in the integration transistor 104, which enables application of the same bias voltage as the bias voltage VBOL to the thermoelectric conversion element 102.

The switch 106 is provided for preventing the operational amplifier 105 from oscillating when all the thermoelectric conversion elements 102 connected to the read circuits 134 are in non-selected state (for example, a period when all the horizontal switches 103 are turned OFF or when all the pixel switches 101 are turned OFF). The switch 106 is provided between the gate and the source of the integration transistor 104, and is turned ON during a period when the thermoelectric conversion elements 102 are in the non-selected state. In this case, the output of the operational amplifier 105 is connected to the inverting input thereof, and thus the operational amplifier 105 operates as a voltage follower. This prevents the operational amplifier 105 from oscillating.

The bypass capacitor 107 prevents the operational amplifier 105 from oscillating that may occur if a defect in a manufacturing process causes an open fault of the thermoelectric conversion element 102 and a bias current does not flow. If the bias current does not flow in the thermoelectric conversion element 102, that is, if a drain current does not flow in the integration transistor 104, a transconductance gm of the integration transistor 104 is reduced and a resistance component of a feedback loop of the operational amplifier 105 is increased. In this case, a phase delay at the feedback loop is increased and thus a phase margin of the operational amplifier 105 may not be ensured. The bypass capacitor 107 provided between the gate and the source of the integration transistor 104 plays a role of ensuring the phase margin.

The bias cancel circuit 142 is used for cancelling the drain current of the integration transistor 104, i.e., an offset component of a current flowing through the thermoelectric conversion element 102. To cancel the offset component is effective for effectively using a dynamic range of the integration sample hold circuit 131.

More specifically, the bias cancel circuit 142 includes a canceller resistor 109, a canceller horizontal switch 110, a canceller transistor 111, an operational amplifier 112, and a switch 113. As the canceller transistor 111, a P-channel MOSFET is used. The canceller resistor 109 and the canceller horizontal switch 110 are connected in series between a power supply line VCC to which a power supply voltage is supplied and a source of the canceller transistor 111. The switch 113 is connected between a gate and the source of the canceller transistor 111, and a drain of the canceller transistor 111 is connected to the drain of the integration transistor 104. The gate of the canceller transistor 111 is connected to an output of the operational amplifier 112. An inverting input of the operational amplifier 112 is connected to the source of the canceller transistor 111, and a non-inverting input terminal of the operational amplifier 112 is connected to a voltage terminal 114 to which a bias cancel voltage VCAN is supplied. A current flowing in the bias cancel circuit 142 is controlled in response to the bias cancel voltage VCAN. As in the case of the operational amplifier 105 of the bias circuit 141, the operational amplifier 112 is provided for the purpose of compensating a gate-source voltage drop in the canceller transistor 111.

As in the case of the switch 106 of the bias circuit 141, the switch 113 of the bias cancel circuit 142 is provided for preventing the operational amplifier 112 from oscillating when all the thermoelectric conversion elements 102 connected to the read circuits 134 are in non-selected state. When all of the thermoelectric conversion elements 102 connected to the read circuits 134 are in the non-selected state, a current in the bias circuit 141 is shut off, which will result in no path through which a current in the bias cancel circuit 142 can flow. For this reason, the canceller horizontal switch 110 is turned OFF in synchronization with the horizontal switch 103, and the current in the bias cancel circuit 142 is shut off. The switch 113 provided between the gate and the source of the canceller transistor 111 is turned ON during the period when all the thermoelectric conversion elements 102 are in the non-selected state. In this case, the output of the operational amplifier 112 is connected to the inverting input thereof, and thus the operational amplifier 112 operates as a voltage follower. This prevents the operational amplifier 112 from oscillating.

The integration sample hold circuit 131 includes an integration operational amplifier 116, two integration-hold capacitors 119 and 122, switches 118, 120, 121 and 123, a reset switch 125, source followers 128 and 129, and a selection switch 130. The integration sample hold circuit 131 is configured to use one of the integration-hold capacitors 119 and 122 as an integration capacitor and to use the other one as a hold capacitor that holds a voltage signal obtained by an integral operation. The selection switch 130 is used for selecting the integration-hold capacitors 119 and 122. If the integration-hold capacitor 119 is selected by the selection switch 130, a voltage signal OUTA held by the integration-hold capacitor 119 is output to the source follower 132 through the source follower 128. On the other hand, if the integration-hold capacitor 122 is selected, a voltage signal OUTB held by the integration-hold capacitor 122 is output to the source follower 132 through the source follower 129. A reset operation of the integration sample hold circuit 131 is performed by turning ON the reset switch 125 with the integration-hold capacitor used as the integration capacitor being electrically connected between an input and an output of the integration operational amplifier 116.

The reset operation of the integration sample hold circuit 131 is performed during the period when all of the thermoelectric conversion elements 102 are in the non-selected state. It should be noted here that the bias circuit 141 and the bias cancel circuit 142 both are in invalid states during the period when all the thermoelectric conversion elements 102 are in the non-selected state. For this reason, a switch 115 for separating the integration sample hold circuit 131 from the bias circuit 141 and bias cancel circuit 142 is provided in the read circuit 134 of FIG. 1 in order to surely perform the reset operation. The switch 115 is turned OFF during when the reset operation of the integration sample hold circuit 131 is performed.

Japanese Laid-Open Patent Application No. 2007-033177 discloses a similar configuration of a read circuit. Specifically, the document discloses a read circuit in which an integration circuit and a sample hold circuit are used instead of the integration sample hold circuit 131.

The inventor of the present application has recognized the following points. One problem of the read circuit 134 shown in FIG. 1 is that a gate voltage of the integration transistor 104 can excessively increase. If a high-temperature subject is imaged, an output of the integration operational amplifier 116 is saturated at an upper limit of an output dynamic range, and an imaginary short of the integration operational amplifier 116 is broken. If the imaginary short of the integration operational amplifier 116 is broken, a drain voltage of the integration transistor 104 is decreased and hence a drain-source voltage is decreased. Meanwhile, the integration transistor 104 and the operational amplifier 105 attempt to supply a current corresponding to the bias voltage VBOL to the thermoelectric conversion element 102, and therefore the gate voltage of the integration transistor 104 is increased. In the worst case, the gate voltage is raised to an upper limit of an output dynamic range of the operational amplifier 105. The gate voltage of the integration transistor 104 recovers to a normal operating voltage by the reset operation of the integration sample hold circuit 131; however, it takes some time to recover to the normal operating voltage. This can cause increase in a settling time of the reset operation of the integration sample hold circuit 131.

A similar problem can also arise in the bias cancel circuit 142. If a low-temperature subject is imaged, an output of the integration operational amplifier 116 is saturated at a lower limit of the output dynamic range, and the imaginary short of the integration operational amplifier 116 is broken. If the imaginary short of the integration operational amplifier 116 is broken, a drain voltage of the canceller transistor 111 is increased and hence a drain-source voltage is decreased. Meanwhile, the canceller transistor 111 and the operational amplifier 112 attempt to supply a current corresponding to the bias cancel voltage VCAN to the thermoelectric conversion element 102, and therefore a gate voltage of the canceller transistor 111 is decreased. In the worst case, the gate voltage is decreased to a lower limit of an output dynamic range of the operational amplifier 112. The gate voltage of the canceller transistor 111 recovers to a normal operating voltage by the reset operation of the integration sample hold circuit 131; however, it takes some time to recover to the normal operating voltage. This can cause increase in the settling time of the reset operation of the integration sample hold circuit 131.

SUMMARY

In one embodiment of the present invention, a read circuit is provided. The read circuit comprises: an integration circuit section configured to perform an integral operation and whose input is connected to an integration node; and a bias circuit connected between a connection node to which a variable resistive element is connected and the integration node. The bias circuit comprises: an integration transistor whose source is connected to the connection node and whose drain is connected to the integration node; a first operational amplifier whose output is connected to a gate of the integration transistor, to whose first input a bias voltage is supplied, and whose second input is connected to the source of the integration transistor; and at least one diode element that is connected between the gate and the source of the integration transistor and clips a gate-source voltage of the integration transistor. In the read circuit thus constructed, the excessive increase in the gate voltage of the integration transistor can be prevented due to the clipping operation of the diode element.

In another embodiment of the present invention, a variable resistive element device is provided. The variable resistive element comprises: a read circuit; and a variable resistive element connected to a connection node of the read circuit. The read circuit comprises: an integration circuit section configured to perform an integral operation and whose input is connected to an integration node; and a bias circuit connected between the connection node and the integration node. The bias circuit comprises: an integration transistor whose source is connected to the connection node and whose drain is connected to the integration node; an operational amplifier whose output is connected to a gate of the integration transistor, to whose first input a bias voltage is supplied, and whose second input is connected to the source of the integration transistor; and at least one diode element that is connected between the gate and the source of the integration transistor and clips a gate-source voltage of the integration transistor.

In still another embodiment of the present invention, an imaging device is provided. The imaging device comprises: a plurality of thermoelectric conversion elements; a read circuit; and a selection circuit configured to connect a thermoelectric conversion element selected from the plurality of thermoelectric conversion elements with a connection node of the read circuit. The read circuit comprises: an integration circuit section configured to perform an integral operation and whose input is connected to an integration node; and a bias circuit connected between the connection node and the integration node. The bias circuit comprises: an integration transistor whose source is connected to the connection node and whose drain is connected to the integration node; an operational amplifier whose output is connected to a gate of the integration transistor, to whose first input a bias voltage is supplied, and whose second input is connected to the source of the integration transistor; and at least one diode element that is connected between the gate and the source of the integration transistor and clips a gate-source voltage of the integration transistor.

According to the present invention, it is possible to prevent an excessive increase in a gate voltage of an integration transistor of a bias circuit in a read circuit that uses the integration circuit for sensing a current.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION OF PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

First Embodiment (Overall Configuration)

Figure 2:
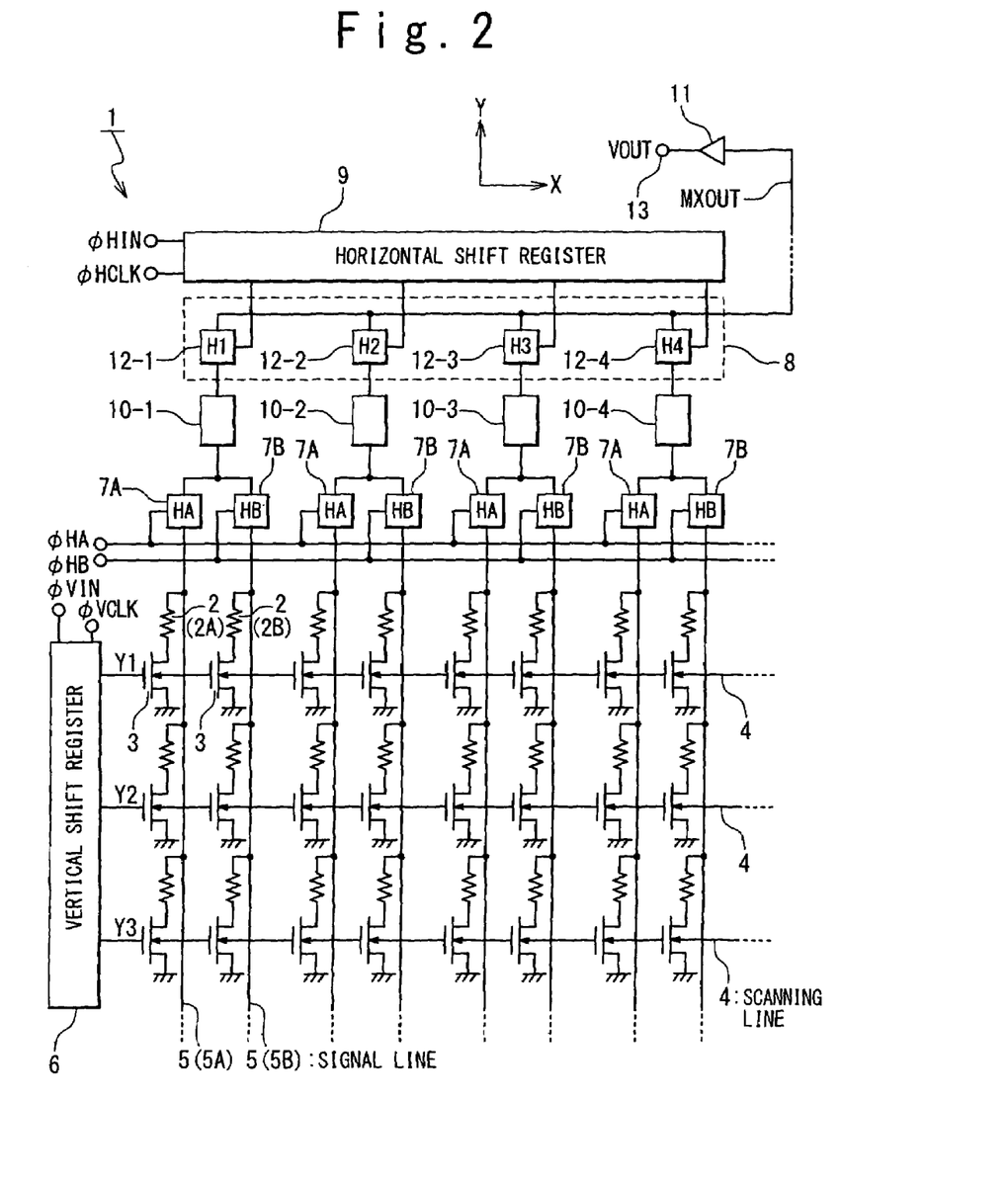
FIG. 2 is a conceptual diagram illustrating a configuration of an imaging device in a first embodiment according to the present invention.

FIG. 2 is a circuit diagram illustrating a configuration of an imaging device 1 in a first embodiment according to the present invention. The imaging device 1 of the present embodiment has a configuration for taking an infrared image. More specifically, the imaging device 1 is provided with thermoelectric conversion elements 2, pixel switches 3, scanning lines 4, and signal lines 5. The scanning lines 4 are so provided as to extend in a row direction of the thermoelectric conversion elements 2 (an X-axis direction in FIG. 2), and the signal lines 5 are so provided as to extend in a column direction of the thermoelectric conversion elements 2 (a Y-axis direction in FIG. 2).

The thermoelectric conversion element 2 is sensitive to incident infrared light, and is configured such that a resistance thereof varies depending on intensity of the incident infrared light. In the present embodiment, bolometers formed in a matrix form on a semiconductor substrate are used as the thermoelectric conversion elements 2. Each thermoelectric conversion element 2 is connected to the signal line 5 at one end thereof and to the pixel switch 3 at the other end thereof.

The pixel switch 3 is provided for each thermoelectric conversion element 2 on a one-on-one basis. The pixel switch 3 is used to select rows of the thermoelectric conversion elements 2. In the present embodiment, an N-channel MOSFET is used as the pixel switch 3. A source of the N-channel MOSFET is grounded, a gate thereof is connected to the scanning line 4, and a drain thereof is connected to the thermoelectric conversion element 2. The scanning lines 4 are connected to a vertical shift register 6 and sequentially selected by the vertical shift register 6. Specifically, the vertical shift resister 6 is configured to supply row selection signals Y1, Y2, Y3 . . . to the respective scanning lines 4. The row selection signal Yj is supplied to the scanning line 4 that is provided along the thermoelectric conversion elements 2 of the j-th row. The vertical shift register 6 sequentially activates the row selection signals Y1, Y2, Y3 . . . in synchronization with a vertical clock signal φVCLK. The timing at which the row selection signal Yj is activated by the vertical shift register 6 is controlled by a vertical control signal φVIN. When the row selection signal Yj is activated by the vertical shift register 6, the row of the thermoelectric conversion elements 2 connected to the pixel switches 3 corresponding to the scanning line 4 to which the row selection signal Yj is supplied is selected.

The imaging device 1 is further provided with n pieces of read circuits 10-1 to 10-n (note that four read circuits 10-1 to 10-4 are illustrated in FIG. 2 as an example). In the following description, each of the read circuits 10-1 to 10-n may be referred to as just a read circuit 10 if they need not be distinguished from one another. The read circuit 10 senses a current flowing through a selected thermoelectric conversion element 2 and outputs a voltage signal whose voltage level corresponds to the sensed current. A detailed configuration of the read circuit 10 will be described later. In the present embodiment, one read circuit 10 is provided for two signal lines 5. A signal line 5 connected to the read circuit 10 is selected by a selection circuit including horizontal switches 7A and 7B. Control signals φHA and φHB are supplied to the horizontal switches 7A and 7B, respectively. When the control signal φHA is activated, the signal line 5 connected to the horizontal switch 7A is connected to the read circuit 10. When the control signal φHB is activated, the signal line 5 connected to the horizontal switch 7B is connected to the read circuit 10. Hereinafter, the signal line 5 connected to the horizontal switch 7A may be referred to as a signal line 5A, and the signal line 5 connected to the horizontal switch 7B may be referred to as a signal line 5B. Also, the thermoelectric conversion element 2 connected to the signal line 5A may be referred to as a thermoelectric conversion element 2A, and the thermoelectric conversion element 2 connected to the signal line 5B may be referred to as a thermoelectric conversion element 2B.

The imaging device 1 is further provided with a multiplexer 8, a horizontal shift register 9, and an output buffer 11. The multiplexer 8 is a circuit for selectively connecting any of the read circuits 10 to an input of the output buffer 11, and includes multiplexer switches 12-1 to 12-n. A column selection signal Hi is supplied from the horizontal shift register 9 to the multiplexer switch 12-$i$. The horizontal shift register 9 sequentially activates the column selection signals H1, H2, H3 . . . in synchronization with a horizontal clock signal φHCLK. The timing at which the column selection signal Hi is activated by the horizontal shift register 9 is controlled by a horizontal control signal φHIN. When the column selection signal Hi is activated by the horizontal shift register 9, the read circuit 10-$i$ connected to the multiplexer switch 12-$i$ to which the column selection signal Hi is supplied is selected. The voltage signal output from the selected read circuit 10 is output as a multiplexer output MXOUT to the output buffer 11. The output buffer 11 operates as a voltage follower, and outputs from an output terminal 13 an output signal VOUT whose voltage level corresponds to the multiplexer output MXOUT.

(Configuration of Read Circuit)

Figure 3:
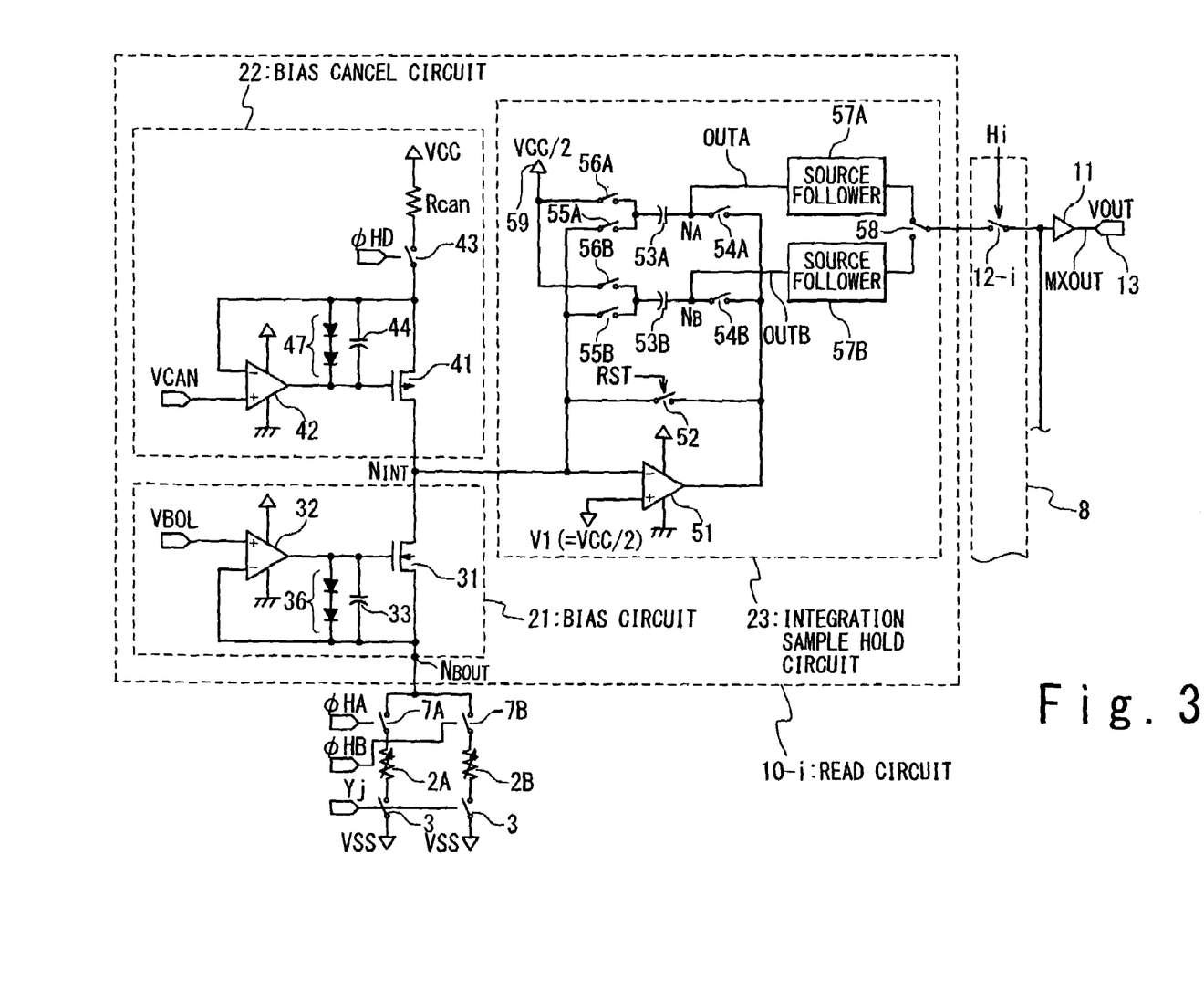
FIG. 3 is a circuit diagram illustrating a configuration of a read circuit in the first embodiment according to the present invention.

FIG. 3 is a circuit diagram illustrating a configuration of the read circuit 10. The read circuit 10 is provides with a bias circuit 21, a bias cancel circuit 22, and an integration sample hold circuit 23.

The bias circuit 21 plays a role of supplying the same bias voltage as a bias voltage VBOL to the thermoelectric conversion element 2 connected to a connection node $N_{BOUT}$. Specifically, the bias circuit 21 is provided with an integration transistor 31, an operational amplifier 32, and a bypass capacitor 33. In the present embodiment, an N-channel MOSFET is used as the integration transistor 31. A drain of the integration transistor 31 is connected to an integration node $N_{INT}$ connected to the integration sample hold circuit 23, and a source of the integration transistor 31 is connected to the connection node $N_{BOUT}$ connected to the thermoelectric conversion element 2. A gate of the integration transistor 31 is connected to an output of the operational amplifier 32. An inverting input of the operational amplifier 32 is connected to the source of the integration transistor 31. The bias voltage VBOL is supplied to a non-inverting input terminal of the operational amplifier 32. The bypass capacitor 33 is connected between the gate and the source of the integration transistor 31.

As in the case of the operational amplifier 105 shown in FIG. 1, the operational amplifier 32 plays a role of compensating a gate-source voltage drop in the integration transistor 31. The operational amplifier 32 compensates the voltage drop in the integration transistor 31, which enables application of the same bias voltage as the bias voltage VBOL to the thermoelectric conversion element 2. The bypass capacitor 33 is provided for ensuring a phase margin. The bypass capacitor 33 prevents the operational amplifier 32 from oscillating that may occur if a defect in a manufacturing process causes an open fault in the thermoelectric conversion element 2 and no current flows through the integration transistor 31.

The bias circuit 21 is further provided with at least one diode element 36 that is connected between the gate and the source of the integration transistor 31. The diode element 36 is so connected as to have a forward direction in a direction from the gate toward the source of the integration transistor 31. The diode element 36 plays a role of clipping a gate-source voltage of the integration transistor 31 to a desired voltage and thereby preventing an excessive increase in a gate voltage of the integration transistor 31. As will be described later, to provide the diode element 36 in the bias circuit 21 is one of features of the read circuit 10 in the present embodiment.

The bias cancel circuit 22 is a circuit for cancelling the drain current of the integration transistor 31, i.e., for cancelling an offset component of the current flowing through the thermoelectric conversion element 2. To cancel the offset component enables an effective usage of a dynamic range of the integration sample hold circuit 23.

Specifically, the bias cancel circuit 22 is provided with a canceller transistor 41, an operational amplifier 42, a canceller horizontal switch 43, a canceller resistor Rcan, and a bypass capacitor 44. For example, a P-channel MOSFET is used as the canceller transistor 41. A drain of the canceller transistor 41 is connected to the drain of the integration transistor 31 through the integration node $N_{INT}$. A gate of the canceller transistor 41 is connected to an output terminal of the operational amplifier 42. An inverting input of the operational amplifier 42 is connected to a source of the canceller transistor 41. A bias cancel voltage VCAN is supplied to a non-inverting input of the operational amplifier 42. A current flowing in the bias cancel circuit 22 is controlled in response to the bias cancel voltage VCAN. As in the case of the operational amplifier 32 of the bias circuit 21, the operational amplifier 42 is provided for the purpose of compensating a gate-source voltage drop in the canceller transistor 41. The canceller horizontal switch 43 and the canceller resistor Rcan are connected in series between the source of the canceller transistor 41 and a power supply line to which a power supply voltage VCC is supplied. A control signal φHD is supplied to the canceller horizontal switch 43. The canceller horizontal switch 43 is controlled by the control signal φHD.

The bias cancel circuit 22 is further provided with at least one diode element 47 that is connected between the gate and the source of the canceller transistor 41. The diode element 47 is so connected as to have a forward direction in a direction from the source toward the gate of the canceller transistor 41. The diode element 47 plays a role of clipping a gate-source voltage of the canceller transistor 41 to a desired voltage and thereby preventing an excessive decrease in a gate voltage of the canceller transistor 41. As will be described later, to provide the diode element 47 in the bias cancel circuit 22 is another feature of the read circuit 10 in the present embodiment.

The integration sample hold circuit 23 functions as an "integration circuit section" for integrating a difference between the current flowing in the bias circuit 21 and the current flowing in the bias cancel circuit 22 to extract a signal component of the current flowing through the thermoelectric conversion element 2 as a voltage signal. The integration sample hold circuit 23 is provided with an integration operational amplifier 51, a reset switch 52, two integration-hold capacitors 53A and 53B, switches 54A to 56A and 54B to 56B, source followers 57A and 57B, and a selection switch 58.

A predetermined voltage V1 is supplied to a non-inverting input terminal of the integration operational amplifier 51. An inverting input terminal of the integration operational amplifier 51 is connected to the bias circuit 21 through the integration node $N_{INT}$. The voltage V1 input to the non-inverting input of the integration operational amplifier 51 is preferably set to the voltage of VCC/2. Such setting enables the dynamic range of the integration sample hold circuit 23 to be maximized.

The reset switch 52 is connected between an output and the inverting input of the integration operational amplifier 51. A reset signal RST is supplied to the reset switch 52. As will be described later, a reset operation of the integration sample hold circuit 23 is performed by activating the reset signal RST to turn ON the reset switch 52. The non-inverting input terminal and the inverting input terminal of the integrating operational amplifier 51 are virtually short-circuited. Therefore, when the reset switch 52 is turned ON, the inverting input and the output of the integration operational amplifier 51 are reset to the voltage V1. At the same time, charges stored in the integration-hold capacitor (53A or 53B) electrically connected to the inverting input and the output of the integration operational amplifier 51 are cancelled, and thus the reset operation is completed.

The integration-hold capacitors 53A and 53B are connected in parallel between the output terminal and the inverting input terminal of the integration operational amplifier 51. As will be described later, the integration-hold capacitors 53A and 53B are respectively used for sensing currents flowing through the thermoelectric conversion elements 2A and 2B by an integral operation. Voltage signals obtained by the integral operation using the integration-hold capacitor 53A and 53B are held by hold nodes $N_A$ and $N_B$, respectively. Moreover, the integration sample hold circuit 23 is configured such that the integration-hold capacitors 53A and 53B can be electrically separated from the integration operational amplifier 51. That is, the switch 54A is connected between the integration-hold capacitor 53A and the output of the integration operational amplifier 51, and the switch 55A is connected between the integration-hold capacitor 53A and the inverting input of the integration operational amplifier 51. Similarly, the switch 54B is connected between the integration-hold capacitor 53B and the output of the operational amplifier 51, and the switch 55B is connected between the integration-hold capacitor 53B and the inverting input of the integration operational amplifier 51 Electrodes of the integration-hold capacitors 53A and 53B, which are connected to the inverting input terminal, are further connected to a voltage node 59 having the voltage of VCC/2 through the switches 56A and 56B, respectively.

The integration sample hold circuit 23 thus configured can use one of the integration-hold capacitors 53A and 53B as an integration capacitor, and the other one as a hold capacitor for holding the voltage signal obtained by the integral operation. In a case where the integration-hold capacitor 53A is used as the integration capacitor and the integration-hold capacitor 53B is used as the hold capacitor, the switches 54A, 55A and 56B are turned ON while the switches 54B, 55B and 56A are turned OFF. A sampling operation of the voltage signal obtained by the integral operation of the integration-hold capacitor 53A to the hold node $N_A$ is performed by turning OFF the switch 54A. On the other hand, in a case where the integration-hold capacitor 53B is used as the integration capacitor and the integration-hold capacitor 53A is used as the hold capacitor, the switches 54B, 55B and 56A are turned ON while the switches 54A, 55A and 56B are turned OFF. A sampling operation of the voltage signal obtained by the integral operation of the integration-hold capacitor 53B to the hold node $N_B$ is performed by turning OFF the switch 54B.

The source followers 57A, 57B and the selection switch 58 are used for time-divisionally outputting the voltage signals OUTA and OUTB respectively held by the hold nodes $N_A$ and $N_B$ to the multiplexer 8. A selection of the integration-hold capacitor 53A or 53B from which the voltage signal is output to the outside is made by the selection switch 58. In a case where the integration-hold capacitor 53A is selected by the selection switch 58, the voltage signal OUTA held by the hold node $N_A$ corresponding to the integration-hold capacitor 53A is output to the multiplexer 8 through the source follower 57A. If the read circuit 10-$i$ is selected by the multiplexer 8 in this state, the voltage signal OUTA output from the read circuit 10-$i$ is output as the multiplexer output MXOUT to the output buffer 11. On the other hand, in a case where the integration-hold capacitor 53B is selected, the voltage signal OUTB held by the integration-hold capacitor 53B is output to the multiplexer 8 through the source follower 57B. If the read circuit 10-$i$ is selected by the multiplexer 8 in this state, the voltage signal OUTB output from the read circuit 10-$i$ is output as the multiplexer output MXOUT to the output buffer 11.

(Operations of Read Circuit)

Figure 4:
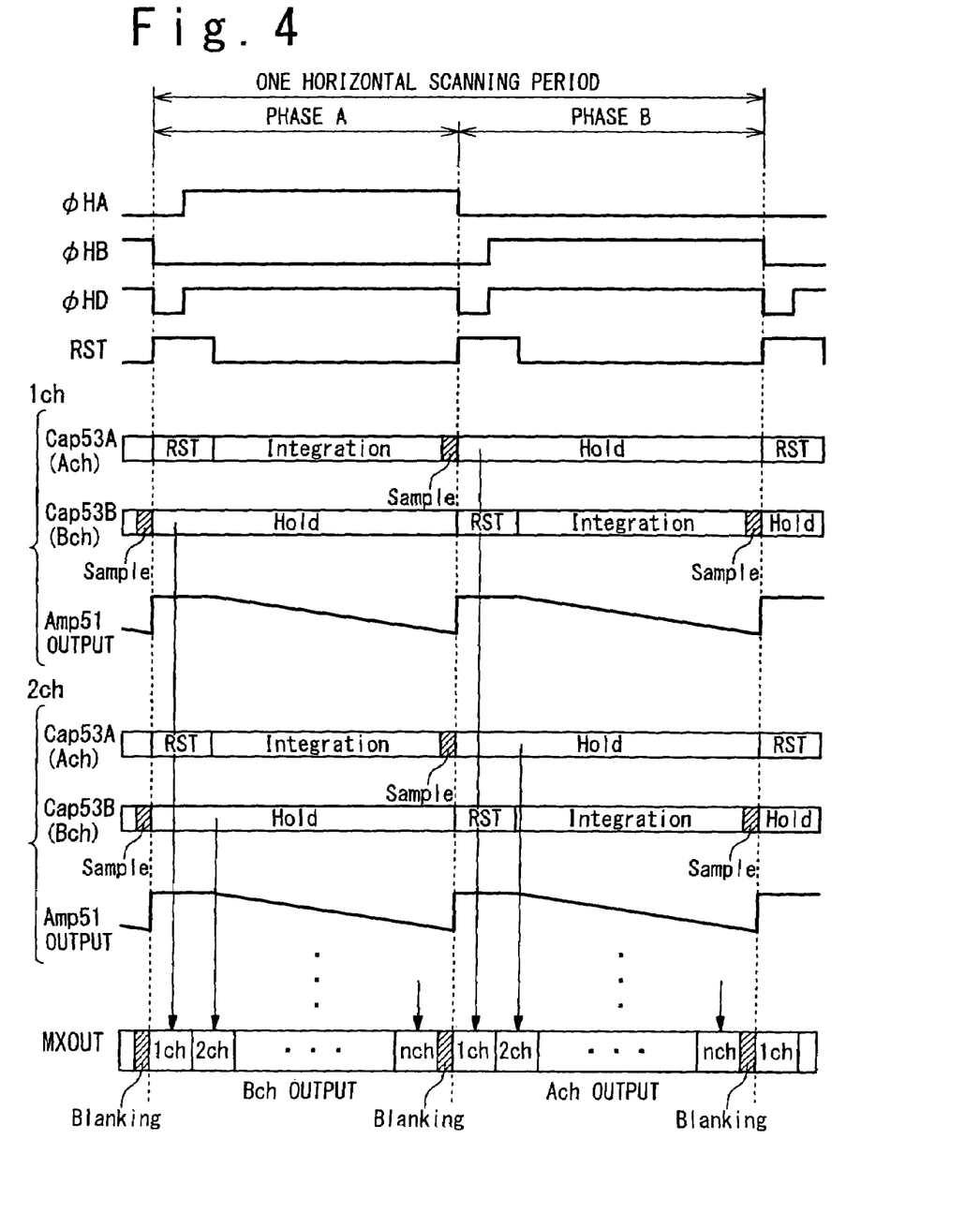
FIG. 4 is a timing chart showing an operation of the read circuit in the first embodiment.

Next, operations of the read circuit 10 in the present embodiment will be described with reference to FIG. 4.

In the present embodiment, one horizontal period (i.e., a period for reading the current flowing through the thermoelectric conversion element 2 corresponding to one scanning line 4) is divided into two phases: phase A and phase B. The phase A corresponds to a period for sensing the current flowing through the thermoelectric conversion element 2A connected to the signal line 5A by using the integration-hold capacitor 53A, and the phase B corresponds to a period for sensing the current flowing through the thermoelectric conversion element 2B connected to the signal line 5B by using the integration-hold capacitor 53B.

The operation in the phase A is as follows. First, the reset operation for the integration operational amplifier 51 and the integration-hold capacitor 53A is performed. Immediately before the start of the reset operation in the phase A, the control signal ϕHA is being deactivated; the control signals ϕHB and ϕHD are being activated; and the reset signal RST is being deactivated. When the reset operation in the phase A is started, the reset signal RST is activated and the control signals ϕHB and ϕHD are deactivated. As a result, the integration operational amplifier 51 and the integration-hold capacitor 53A are reset. Due to the reset operation, the output of the integration operational amplifier 51 is reset to the voltage V1 (typically VCC/2).

Subsequently, an integral operation is performed with the use of the integration-hold capacitor 53A. During the period of the integral operation, an output potential of the integration operational amplifier 51 changes depending on a current flowing through the selected thermoelectric conversion element 2. Note that, in FIG. 4, the output potential of the integration operational amplifier 51 is so illustrated as to decrease; however, it may increase. At the end of the phase A, the sampling operation is performed, and the voltage signal OUTA corresponding to the signal component of the current flowing through the thermoelectric conversion element 2A is sampled at the hold node $N_A$. Furthermore, in the phase A, the voltage signal OUTB sampled at the hold node $N_B$ of each read circuit 10 in the immediately preceding phase B is held, and the voltage signal OUTB being held is time-divisionally output as the multiplexer output MXOUT.

In the phase B, a similar operation is also performed. When the phase B is started, the reset operation of the integration-hold capacitor 53B is performed, and then the integral operation is performed with the use of the integration-hold capacitor 53B. At the end of the phase B, the sampling operation is performed, and the voltage signal OUTB corresponding to the signal component of the current flowing through the thermoelectric conversion element 2B is sampled at the hold node $N_B$. Furthermore, in the phase B, the voltage signal OUTA sampled at the hold node $N_A$ of each read circuit 10 in the immediately preceding phase A is held, and the voltage signal OUTA being held is time-divisionally output as the multiplexer output MXOUT.

As previously pointed out, in any of the phase A and the phase B, if a high-temperature subject is imaged and the current flowing through the thermoelectric conversion element 2 is largely decreased, the output of the integration operational amplifier 51 is saturated at the upper limit of the output dynamic range upon the integral operation. As described above, the saturation of the output of the integration operational amplifier 51 at the upper limit can cause the problem that the gate voltage of the integration transistor 31 is excessively increased.

However, according to the read circuit 10 of the present embodiment, the diode element 36 is provided in the bias circuit 21, which can effectively prevent the problem that the gate voltage of the integration transistor 31 is excessively increased. More specifically, when the gate voltage of the integration transistor 31 is increased, the diode element 36 provides a current path through which a current flows to the thermoelectric conversion element 2 directly from the operational amplifier 32. Consequently, the gate voltage of the integration transistor 31 (namely, the output voltage of the operational amplifier 32) can be clipped without being saturated at an upper limit of an output dynamic range of the operational amplifier 32. This can effectively prevent the deterioration of the settling time of the reset operation of the integration sample hold circuit 23. Characteristics required for the diode element 36 include the following two items:

(1) the diode element 36 does not turn ON when the normal integral operation is performed. That is, an ON-voltage VDIon of the diode element 36 is higher than a gate-source voltage VGS of the integration transistor 31; and (2) the gate voltage of the integration transistor 31 when clipped by the diode elements 36 is lower than the upper limit of the output dynamic range of the operational amplifier 32.

In FIG. 3, two diode elements 36 are connected in series; however, the number of the diode elements 36 is not limited to two. The number of the diode elements 36 to be connected in series is arbitrarily adjusted depending on a voltage to which the gate voltage of the integration transistor 31 is clipped.

A similar problem can also arise in the bias cancel circuit 32. That is, if a low-temperature subject is imaged and the current flowing through the thermoelectric conversion element 2 is increased, the output of the integration operational amplifier 51 is saturated at a lower end of the output dynamic range. As described above, the saturation of the output of the integration operational amplifier 51 at the lower end can cause the problem that the gate voltage of the canceller transistor 41 is excessively decreased.

However, according to the read circuit 10 of the present embodiment, the above-mentioned problem is avoided by providing the diode element 47 in the bias cancel circuit 22. When the gate voltage of the canceller transistor 41 starts to excessively decrease, the diode element 47 clips a gate-source voltage of the canceller transistor 41, and thus the decrease of the gate voltage is effectively suppressed. This can effectively prevent the deterioration of the settling time of the reset operation of the integration sample hold circuit 23. Characteristics required for the diode element 47 are the same as those for the above-described diode element 36.

In FIG. 3, two diode elements 47 are connected in series; however, the number of the diode elements 47 is not limited to two. The number of the diode elements 47 to be connected in series is arbitrarily adjusted depending on a voltage to which the gate voltage of the canceller transistor 41 is clipped.

As described above, according to the read circuit 10 of the present embodiment, the excessive increase in the gate voltage of the integration transistor 31 is effectively prevented by providing the diode element 36 in the bias circuit 21. In addition, the excessive decrease in the gate voltage of the canceller transistor 41 is effectively prevented by providing the diode element 47 in the bias cancel circuit 22. Any one of these contributes to preventing the deterioration of the settling time of the reset operation of the integration sample hold circuit 23.

Second Embodiment

Figure 5:
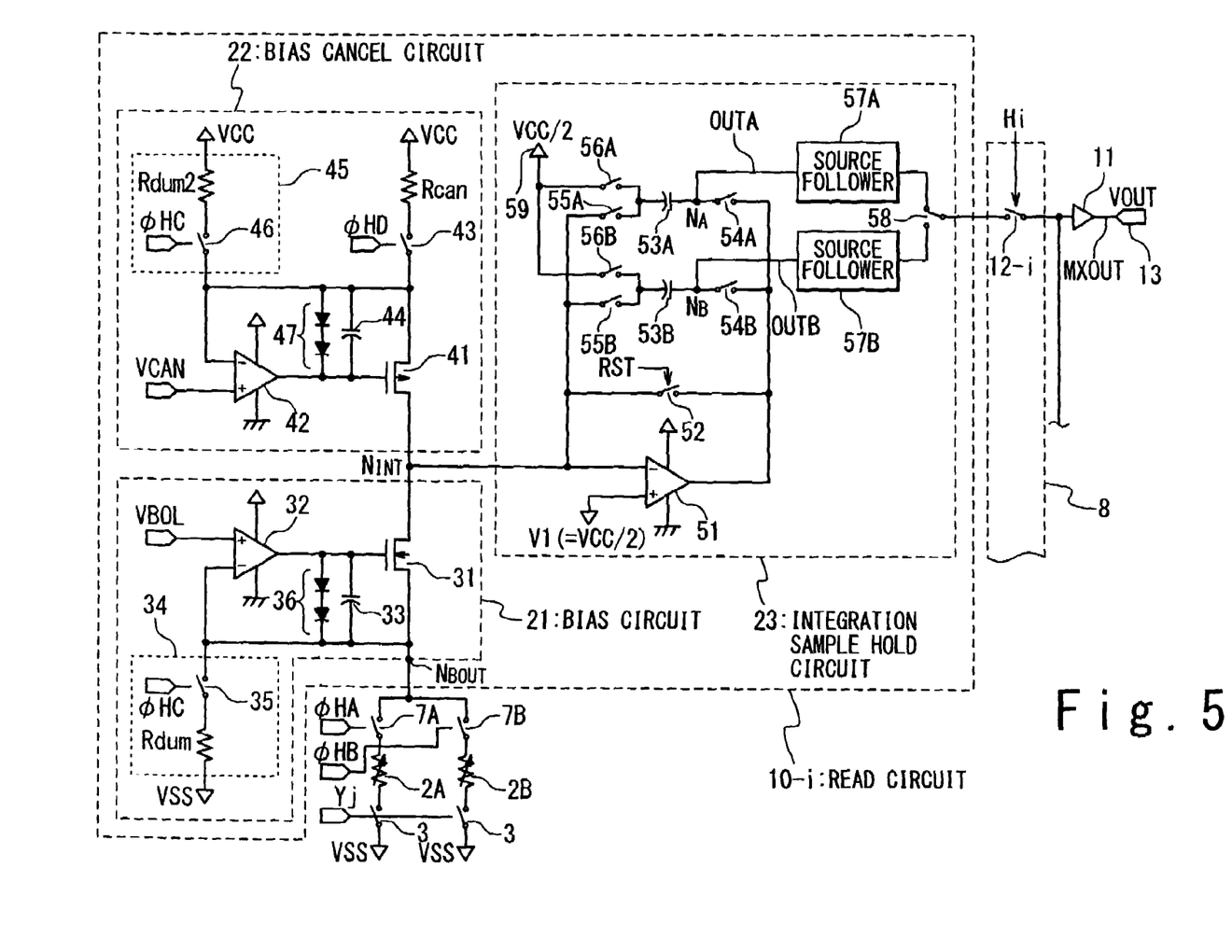
FIG. 5 is a circuit diagram illustrating a configuration of a read circuit in a second embodiment according to the present invention.

FIG. 5 is a circuit diagram illustrating a configuration of a read circuit 10 in a second embodiment of the present invention. The read circuit 10 in the second embodiment differs from the read circuit 10 in the first embodiment in that the bias circuit 21 is further provided with a current switching circuit 34 and the bias cancel circuit 22 is further provided with a current switching circuit 45. The rest of the configuration of the read circuit 10 in the second embodiment is the same as that in the first embodiment.

The current switching circuit 34 is used for ensuring a current path through which a drain current of the integration transistor 31 can flow without passing through the connection node $N_{BOUT}$ when the connection node $N_{BOUT}$ is brought into a high impedance state. To provide the current switching circuit 34 in the bias circuit 21 is one of features of the read circuit 10 of the second embodiment. In the present embodiment, the current switching circuit 34 includes: a current switch 35 that operates in response to a control signal φHC; and a dummy resistor Rdum. Typically, the dummy resistor Rdum is a polysilicon resistor or an N-well resistor. The current switch 35 and the dummy resistor Rdum are connected in series between the source of the integration transistor 31 and a ground line having a ground voltage VSS. By activating the control signal φHC to turn ON the current switch 35, it is possible to pass the drain current of the integration transistor 31 to the ground line through the current switch 35 and the dummy resistor Rdum.

The current switching circuit 45 is used for ensuring a current path through which a drain current of the canceller transistor 41 can flow without passing through the canceller horizontal switch 43. To provide the current switching circuit 45 in the bias cancel circuit 22 is another feature of the read circuit 10 of the second embodiment. In the present embodiment, the current switching circuit 45 includes: a current switch 46 that operates in response to the control signal φHC; and a dummy resistor Rdum2. The current switch 46 and the dummy resistor Rdum2 are connected in series between the source of the canceller transistor 41 and the power supply line having the power supply voltage VCC. By activating the control signal φHC to turn ON the current switch 46, it is possible to path the drain current of the canceller transistor 41 from the power supply line through the current switch 46 and the dummy resistor Rdum2.

Figure 6:
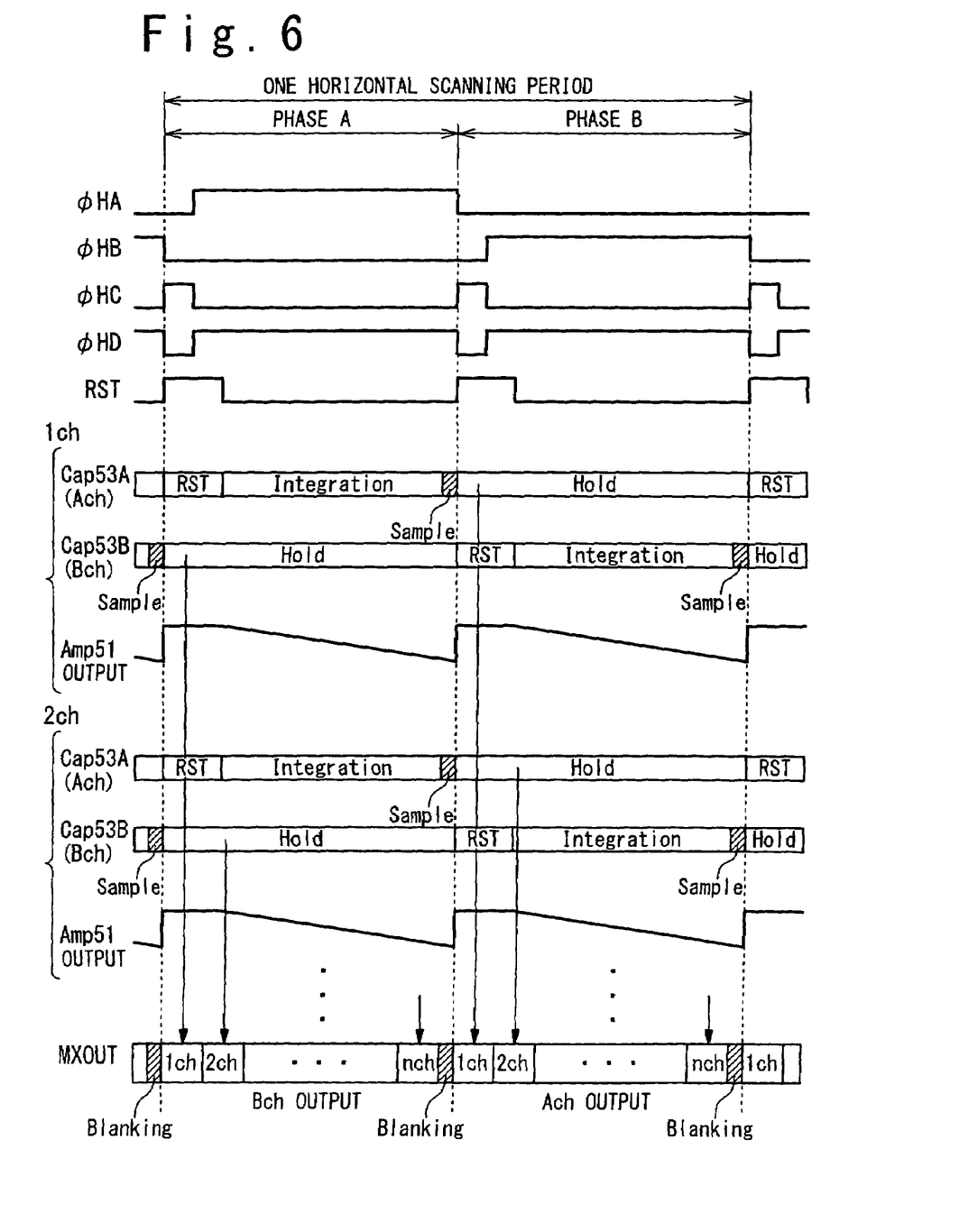
FIG. 6 is a timing chart showing an operation of the read circuit in the second embodiment.

Next, operations of the read circuit 10 in the second embodiment will be described with reference to FIG. 6. It should be noted that in the second embodiment, as shown in FIG. 6, the control signal φHC in addition to the control signals φHA, φHB and φHD are used for controlling the operation of read circuit 10. As described above, the control signal φHC is a signal for controlling the current switches 35 and 46 of the current switching circuits 34 and 45, respectively.

As in the case of the first embodiment, one horizontal period (i.e., a period for reading the current flowing through the thermoelectric conversion element 2 corresponding to one scanning line 4) is divided into two phases: phase A and phase B. In the phase A, the reset operation of the integration-hold capacitor 53A is performed, and then the integral operation is performed with the use of the integration-hold capacitor 53A. At the end of the phase A, the sampling operation is performed, and the voltage signal OUTA corresponding to the signal component of the current flowing through the thermoelectric conversion element 2A is sampled at the hold node $N_A$. Furthermore, in the phase A, the voltage signal OUTB sampled at the hold node $N_B$ of each read circuit 10 in the immediately preceding phase B is held, and the voltage signal OUTB being held is time-divisionally output as the multiplexer output MXOUT.

A similar operation is also performed in the phase B. In the phase B, the reset operation of the integration-hold capacitor 53B is performed, and then the integral operation is performed with the use of the integration-hold capacitor 53B. At the end of the phase B, the sampling operation is performed, and the voltage signal OUTB corresponding to the signal component of the current flowing through the thermoelectric conversion element 2B is sampled at the hold node $N_B$. Furthermore, in the phase B, the voltage signal OUTA sampled at the hold node $N_A$ of each read circuit 10 in the immediately preceding phase A is held, and the voltage signal OUTA being held is time-divisionally output as the multiplexer output MXOUT.

As will be understood from FIG. 6, in the reset operation of the integration sample hold circuit 23, there exists a period when both of the control signals φHA and φHB are deactivated, i.e., a period when the horizontal switches 7A and 7B are both turned OFF.

Let us consider a case of the phase A as an example. Immediately before the start of the reset operation of the integration-hold capacitor 53A, the control signal φHA is being deactivated; the control signals φHB and φHD are being activated; and the reset signal RST is being deactivated. When the reset operation in the phase A is started, the reset signal RST is activated and the control signals φHB and φHD are deactivated. As a result, both of the horizontal switches 7A and 7B are turned OFF, and thus the connection node $N_{BOUT}$ of the bias circuit 21 is brought into a high impedance state. To turn OFF both of the horizontal switches 7A and 7B is of technical significance in avoiding influence of a delay of the row selection signal Yj at the scanning line 4. The time period during which the horizontal switches 7A and 7B are turned OFF is so set as to exceed a time period necessary for the row selection signal Yj to be transmitted from the leftmost pixel switch 3 to the rightmost pixel switch 3.

After that, the control signal φHA is activated and the horizontal switch 7A is turned ON. When the horizontal switch 7A is turned ON, the current flowing through the thermoelectric conversion element 2A starts flowing in the bias circuit 21 and the bias cancel circuit 22. After that, the reset signal RST is deactivated again and the reset operation is completed.

To shorten the settling time of the reset operation of the integration sample hold circuit 23 is important for shortening a time period from the activation of the control signal φHA to the deactivation of the reset signal RST. If a potential at each node in the integration sample hold circuit 23 is stabilized soon after the activation of the control signal φHA, the reset signal RST can be deactivated soon. This enables increase in a time for the integral operation, which is desirable for noise reduction.

In the read circuit 10 of the present embodiment, the integration transistor 31 is kept in the operating state even in the period when the control signals φHA and φHA both are deactivated and the horizontal switches 7A and 7B are turned OFF, which allows the settling time of the reset operation to be shortened. Specifically, during the period when both of the control signals φHA and φHB are deactivated and the horizontal switches 7A and 7B are turned OFF, the control signal φHC is activated and thus the current switch 35 of the current switching circuit 34 is turned ON. As a result, the drain current of the integration transistor 31 flows to the ground line through the current switch 35 and the dummy resistor Rdum, and thereby the integration transistor 31 is constantly kept in the operating state. Since the integration transistor 31 is constantly kept in the operating state, the integration transistor 31 needs not be recovered from a shut-off state to the operating state upon the reset operation of the integration sample hold circuit 23, which can reduce the settling time of the reset operation of the integration sample hold circuit 23.

A resistance value of the dummy resistor Rdum of the current switching circuit 34 is determined by a trade-off between the shortening of the settling time of the reset operation of the integration sample hold circuit 23 and power consumption. As the resistance value of the dummy resistor Rdum becomes smaller, a larger current flows through the integration transistor 31, a transconductance gm of the integration transistor 31 becomes larger, and hence an impedance of a feedback loop of the operational amplifier 32 can be made smaller. This is effective for shortening the settling time of the reset operation. However, as the resistance value of the dummy resistor Rdum becomes smaller, a current flowing through the dummy resistor Rdum is increased, and thus the power consumption of the entire read circuit 10 is increased. From this point of view, it is preferable that the resistance value of the dummy resistor Rdum is set to the same value as a resistance value of the thermoelectric conversion element 2 at a temperature (e.g., 25 degrees centigrade) near a center of an operating temperature range.

Moreover, in the read circuit 10 of the present embodiment, the canceller transistor 41 of the bias cancel circuit 22 also is always kept in an operating state by the function of the current switching circuit 45. This also contributes to the shortening of the settling time of the reset operation of the integration sample hold circuit 23. More specifically, according to the present embodiment, in the period when both of the control signals φHA and φHB are deactivated and the horizontal switches 7A and 7B are turned OFF, the control signal φHC is activated and the current switch 46 of the current switching circuit 45 is turned ON. On the other hand, the control signal φHD is deactivated and the canceller horizontal switch 43 is turned OFF. As a result, the drain current of the canceller transistor 41 can flow from the power supply line through the current switch 46 and the dummy resistor Rdum2. Accordingly, even when the horizontal switches 7A and 7B are turned OFF, the canceller transistor 41 is constantly kept in the operating state. Therefore, the canceller transistor 41 needs not be recovered from a shut-off state to the operating state upon the reset operation of the integration sample hold circuit 23, which can reduce the settling time of the reset operation of the integration sample hold circuit 23.

Figure 7:
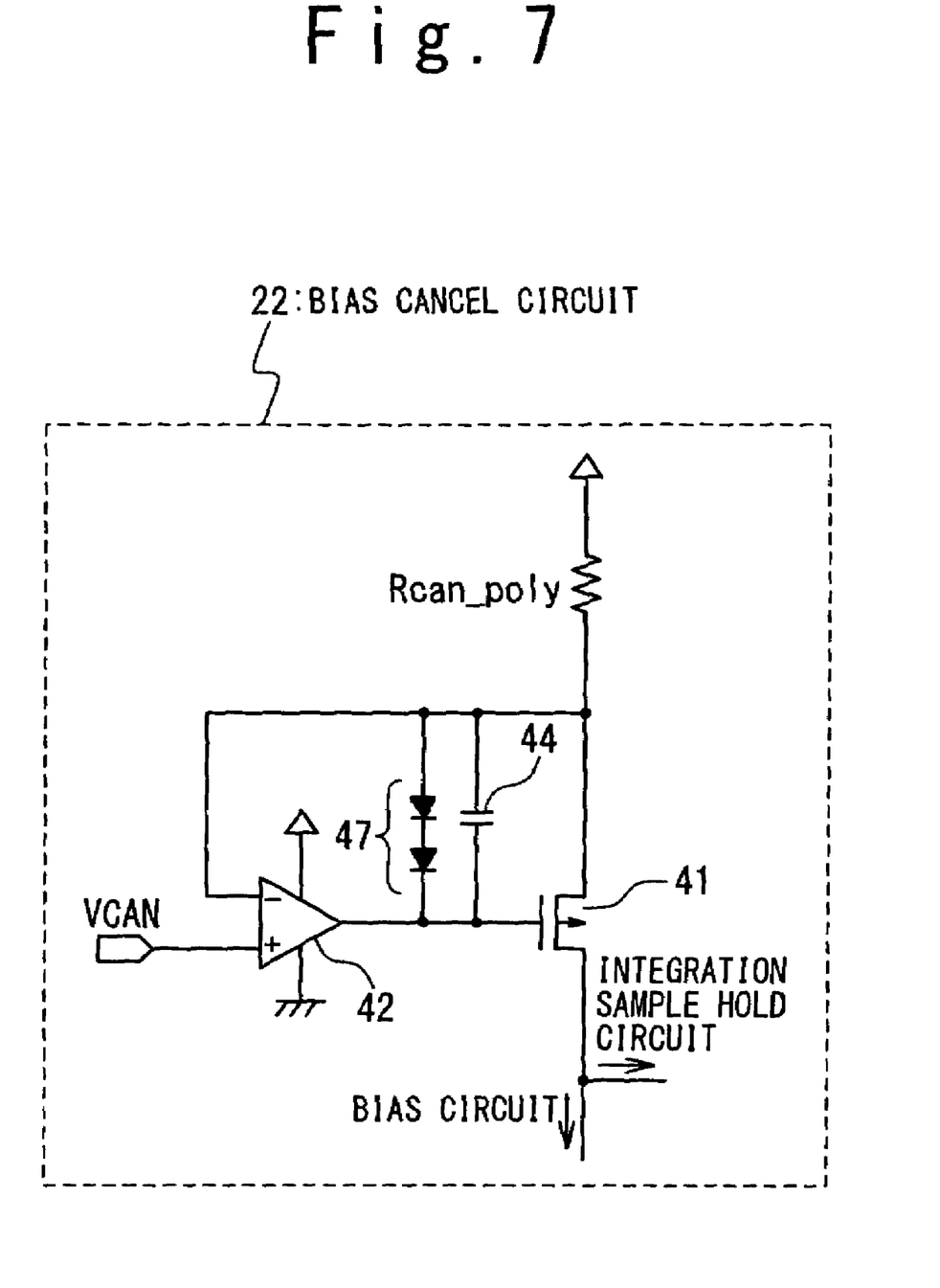
FIG. 7 is a circuit diagram illustrating another configuration of a bias cancel circuit in the second embodiment.

Although FIG. 5 illustrates the configuration example in which both of the bias circuit 21 and the bias cancel circuit 22 are provided with the respective current switching circuits, only the bias circuit 21 may be provided with the current switching circuit 34. That is to say, the bias cancel circuit 22 is not necessarily provided with the current switch circuit 45. For example, if the dummy resistor Rdum of the bias circuit 21 and the canceller resistor Rcan of the bias cancel circuit 22 are both formed of a polysilicon resistor (or N-well resistor), the current switching circuit 45 may be removed from the bias cancel circuit 22 as shown in FIG. 7. In FIG. 7, the canceller resistor formed of a polysilicon resistor is expresses as Rcan_poly. In this case, the canceller horizontal switch 43 also is removed. In the configuration shown in FIG. 7, the canceller resistor Rcan_poly is directly connected between the power supply line and the source of the canceller transistor 41. Also, the bypass capacitor 44 prevents the operational amplifier 42 from oscillating that may occur if a defect in a manufacturing process causes an open fault of the polysilicon resistor (Rcan_poly) and a bias current does not flow. Note that, in the case of the polysilicon resistor, a defective fraction in the manufacturing process is generally low (there is almost no open fault). Therefore, in the case where the polysilicon resistor is used, the bypass capacitor 44 may be unnecessary.

It should be noted that the configuration shown in FIG. 5 where both of the bias circuit 21 and the bias cancel circuit 22 are provided with the respective current switching circuits is preferable in that the current flowing through the bias circuit 21 can be consistent with the current flowing through the bias cancel circuit 22 at the time when the horizontal switches 7A and 7B are turned OFF. At the reset operation of the integration sample hold circuit 23, a difference in the current between the bias circuit 21 and the bias cancel circuit 22 flows into or from the inverting input terminal of the integration operational amplifier 51. If the difference in current between the bias circuit 21 and the bias cancel circuit 22 is excessively large, the integration operational amplifier 51 needs to draw in or discharge a large current, which is not preferable for shortening the settling time. According to the configuration in which the bias circuit 21 and the bias cancel circuit 22 are respectively provided with the current switching circuits, it is possible to make the difference between the current flowing through the bias circuit 21 and the current flowing through the bias cancel circuit 22 approximately zero by appropriately setting the resistance values of the dummy resistor Rdum of the bias circuit 21 and the dummy resistor Rdum2 of the bias cancel circuit 22.

The configuration in which the bias circuit 21 and the bias cancel circuit 22 are respectively provided with the current switching circuits is effective particularly for a case where the resistance value of the dummy resistor Rdum of the bias circuit 21 and the resistance value of the canceller resistor Rcan of the bias cancel circuit 22 are largely different from each other. If the current switching circuit 45 is removed from the bias cancel circuit 22 in the case where the resistance values of the dummy resistor Rdum and the canceller resistor Rcan are largely different from each other, a large difference appears between the current flowing through the bias circuit 21 and the current flowing through the bias cancel circuit 22.

For example, let us consider a case where a polysilicon resistor is used as the dummy resistor Rdum of the bias circuit 21 and a bolometer is used as the canceller resistor Rcan (this sort of bolometer is called a canceller bolometer). A resistance value Rbol@T of the bolometer at a temperature of T (K) is given by the following equation:

$$Rbol@T = A \cdot \exp(-BTa^2/T),$$

where

A: a resistance value of the bolometer at infinite temperature, and

B: a temperature coefficient of the bolometer at a temperature of Ta (K).

According to the above equation, for example, the resistance value of the bolometer that is characterized by the resistance value of 100 kΩ and the temperature coefficient of −2.0%/K at a temperature of 25 degrees centigrade (298 K) can be calculated as follows:

in a case when a bolometer temperature is −40 degrees centigrade, the bolometer resistance value is approximately 500 kΩ; and in a case when a bolometer temperature is 100 degrees centigrade, the bolometer resistance value is approximately 30 kΩ.

As can be understood from this, the resistance values of the dummy resistor Rdum and the canceller resistor Rcan can largely differ from each other depending on the temperature of the canceller bolometer. This increases the difference between the current flowing through the bias circuit 21 and the current flowing through the bias cancel circuit 22, which is not preferable. Therefore, when the bolometer is used as the canceller resistor Rcan of the bias cancel circuit 22, the configuration in which the current switching circuit 45 is provided in the bias cancel circuit 22 is preferable.

Various embodiments of the present invention are described above; however, the present invention is not limited to the above-described embodiments. For example, in the above-described embodiments, the bias circuit 21 and the bias cancel circuit 22 are provided on the power supply side, and the thermoelectric conversion elements 2 are provided on the ground side; however, a configuration in which the thermoelectric conversion elements 2 are provided on the power supply side, and the bias circuit 21 and the bias cancel circuit 22 are provided on the ground side is also possible. In this case, a P-channel MOSFET is used as the integration transistor 31 of the bias circuit 21, and an N-channel MOSFET is used as the canceller transistor 41 of the bias cancel circuit 22. The current switch 35 and the dummy resistor Rdum of the current switching circuit 34 are connected between the integration transistor 31 and the power supply line, and the current switch 46 and the dummy resistor Rdum2 of the current switching circuit 45 are connected between the source of the canceller transistor 41 and the ground line. The canceller horizontal switch 43 and the canceller resistor Rcan also are connected between the source of the canceller transistor 41 and the ground line. In the case where the diode elements 36 and 47 are provided as in the second embodiment, the diode element 36 is so connected as to have a forward direction from the source toward the gate of the integration transistor 31 (which is the P-channel MOSFET), and the diode element 47 is so connected as to have a forward direction from the gate toward the source of the canceller transistor 41 (which is the N-channel transistor).

Also, the configuration of the integration sample hold circuit 23 may be variously modified. For example, if a single signal line 5 is connected to one read circuit 10, the function of using one of the integration-hold capacitors 53A and 53B as the integration capacitor and the other one as the hold capacitor for holding the voltage signal obtained by the integral operation is not necessary. Therefore, if the single signal line 5 is connected to each read circuit 10, generally-used integration circuit and sample-hold circuit instead of the integration sample hold circuit 23 may be used as the integration circuit section.

Also, in the above embodiments, the imaging device for taking an infrared image is described; however, the present invention is not limited to the above-described embodiments. The present invention can also be applied to sensing of a current flowing through other variable resistive elements.

For example, the present invention can be applied to sensing of a current flowing through a magnetoresistance element that is used as a memory cell of an MRAM (Magnetic Random Access Memory), or a current flowing through a memory cell of a phase-change memory. In the case of the MRAM, the magnetoresistance element exhibiting a GMR effect (giant magnetoresistance effect) or a TMR effect (tunnel magnetoresistance effect) is used as a memory cell. A resistance value of the magnetoresistance element varies depending on a data stored therein. In the case of the phase-change memory, phase-change films are integrated in a memory cell. A data is recorded as a state of a part of the phase-change films; whether an amorphous state or a crystalline state. A resistance variation associated with the change in the state is used for reading the data. By sensing a current flowing through the magnetoresistance element or the phase-change memory cell, it is possible to read the data stored therein.

Also, the present invention can be applied to sensing of a current flowing through a microwave/millimeter-wave detection element, a pressure sensor, a gas sensor, or a flow sensor. A sensor array can be constructed by arranging the microwave/millimeter-wave detection elements, pressure sensors, gas sensors, or flow sensors, instead of the thermoelectric conversion elements 2.

It is apparent that the present invention is not limited to the above embodiments and may be modified and changed without departing from the scope and spirit of the invention.

What is claimed is:

1. A read circuit comprising:
   an integration circuit section configured to perform an integral operation and whose input is connected to an integration node; and
   a bias circuit connected between a connection node to which a variable resistive element is connected and said integration node,
   wherein said bias circuit comprises:
   an integration transistor whose source is connected to said connection node and whose drain is connected to said integration node;
   a first operational amplifier whose output is connected to a gate of said integration transistor, to whose first input a bias voltage is supplied, and whose second input is connected to said source of said integration transistor; and
   at least one diode element that is connected between said gate and said source of said integration transistor and clips a gate-source voltage of said integration transistor.

2. The read circuit according to claim 1, further comprising a bias cancel circuit connected to said integration node,
wherein said bias cancel circuit comprises:
a canceller transistor whose drain is connected to said integration node;
a canceller resistor and a canceller switch that are connected in series between a source of said canceller transistor and a node to which a power supply voltage or a ground voltage is supplied;
a second operational amplifier whose output is connected to a gate of said canceller transistor, to whose first input a bias cancel voltage is supplied, and whose second input is connected to said source of said canceller transistor; and
at least one diode element that is connected between said gate and said source of said canceller transistor and clips a gate-source voltage of said canceller transistor.

3. The read circuit according to claim 2,
wherein said bias cancel circuit further comprises: a second current switching circuit configured to provide or shut off a second current path, wherein said second current path is a current path through which a current flowing between said drain and said source of said canceller transistor flows without passing through said canceller resistor and said canceller switch.

4. The read circuit according to claim 3,
wherein said second current switching circuit comprises:
a second current switch; and
a second dummy resistor,
wherein said second current switch and said second dummy resistor are connected in series between said source of said canceller transistor and a node to which a power supply voltage or a ground voltage is supplied.

5. The read circuit according to claim 1,
wherein said bias circuit further comprises: a first current switching circuit configured to provide or shut off a first current path, wherein said first current path is a current path through which a current flowing between said drain and said source of said integration transistor flows without passing through said connection node.

6. The read circuit according to claim 5,
wherein said first current switching circuit comprises:
a first current switch; and
a first dummy resistor,
wherein said first current switch and said first dummy resistor are connected in series between said source of said integration transistor and a node to which a ground voltage or a power supply voltage is supplied.

7. The read circuit according to claim 1,
wherein said integration circuit section comprises:
an integration amplifier whose first input is connected to said integration node and to whose second input a predetermined voltage is supplied;
at least one integration capacitor connected between said first input and an output of said integration amplifier; and
a reset switch connected between said first input and said output of said integration amplifier.

8. A variable resistive element device comprising:
a read circuit; and
a variable resistive element connected to a connection node of said read circuit,
wherein said read circuit comprises:
an integration circuit section configured to perform an integral operation and whose input is connected to an integration node; and
a bias circuit connected between said connection node and said integration node,
wherein said bias circuit comprises:

an integration transistor whose source is connected to said connection node and whose drain is connected to said integration node;

an operational amplifier whose output is connected to a gate of said integration transistor, to whose first input a bias voltage is supplied, and whose second input is connected to said source of said integration transistor; and at least one diode element that is connected between said gate and said source of said integration transistor and clips a gate-source voltage of said integration transistor.

9. The variable resistive element device according to claim 8, wherein said bias circuit further comprises: a current switching circuit configured to provide or shut off a first current path, wherein said first current path is a current path through which a current flowing between said drain and said source of said integration transistor flows without passing through said connection node.

10. The variable resistive element device according to claim 8, wherein said variable resistive element is any of a thermoelectric conversion element, a magnetoresistance element, a phase-change memory cell, a microwave/millimeter-wave detection element, a pressure sensor, a gas sensor and a flow sensor.

11. An imaging device comprising:

a plurality of thermoelectric conversion elements;

a read circuit; and a selection circuit configured to connect a thermoelectric conversion element selected from said plurality of thermoelectric conversion elements with a connection node of said read circuit, wherein said read circuit comprises:

an integration circuit section configured to perform an integral operation and whose input is connected to an integration node; and a bias circuit connected between said connection node and said integration node, wherein said bias circuit comprises:

an integration transistor whose source is connected to said connection node and whose drain is connected to said integration node;

an operational amplifier whose output is connected to a gate of said integration transistor, to whose first input a bias voltage is supplied, and whose second input is connected to said source of said integration transistor; and at least one diode element that is connected between said gate and said source of said integration transistor and clips a gate-source voltage of said integration transistor.

12. The imaging device according to claim 11, wherein said bias circuit further comprises: a current switching circuit configured to provide or shut off a first current path, wherein said first current path is a current path through which a current flowing between said drain and said source of said integration transistor flows without passing through said connection node.

13. The imaging device according to claim 12, further comprising a plurality of signal lines respectively connected to said plurality of thermoelectric conversion elements, wherein said selection circuit comprises switch circuits configured to switch a connection relationship between said plurality of signal lines and said connection node of said read circuit, wherein a control signal is supplied to said current switching circuit, said control signal is activated when said switch circuits disconnect all of said plurality of signal lines from said connection node, and said current switching circuit provides said first current path when said control signal is activated.

* * * * *